(12) United States Patent
Feng et al.

(10) Patent No.: US 7,074,490 B2
(45) Date of Patent: *Jul. 11, 2006

(54) THERMALLY CONDUCTIVE PHASE CHANGE MATERIALS

(75) Inventors: Qian Jane Feng, Midland, MI (US); Lenin James Petroff, Bay City, MI (US); Diane Elizabeth Swarthout, Hemlock, MI (US); Shizhong Zhang, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 264 days.

This patent is subject to a terminal disclaimer.

(21) Appl. No.: 10/436,862

(22) Filed: May 13, 2003

(65) Prior Publication Data

US 2003/0224186 A1 Dec. 4, 2003

Related U.S. Application Data

(63) Continuation-in-part of application No. 10/021,964, filed on Dec. 14, 2001, now Pat. No. 6,620,515.

(51) Int. Cl.
*B12B 9/04* (2006.01)

(52) U.S. Cl. .......... 428/447; 428/473.5; 428/474.4; 428/480; 428/450; 524/404; 524/424; 524/428; 524/430; 524/432; 524/433; 524/439; 528/25; 528/31; 528/32; 528/34

(58) Field of Classification Search .......... 524/404, 524/424, 428, 430, 432, 433, 439, 588; 428/447, 428/450, 473.5, 474.4, 480; 528/25, 31, 32, 528/34; 427/209
See application file for complete search history.

(56) References Cited

U.S. PATENT DOCUMENTS

| | | | |
|---|---|---|---|
| 4,299,715 A | 11/1981 | Whitfield et al. | 252/74 |
| 5,380,527 A | 1/1995 | Legrow et al. | 424/401 |
| 5,493,041 A | 2/1996 | Biggs et al. | 556/453 |
| 5,904,796 A | 5/1999 | Freuler et al. | 156/278 |
| 5,912,805 A | 6/1999 | Freuler et al. | 361/705 |
| 5,929,164 A | 7/1999 | Zhang | 524/862 |
| 5,930,893 A | 8/1999 | Eaton | 29/890.03 |
| 5,950,066 A * | 9/1999 | Hanson et al. | 428/551 |
| 6,054,198 A | 4/2000 | Bunyan et al. | 428/40.5 |
| 6,096,414 A * | 8/2000 | Young | 428/220 |
| 6,169,142 B1 | 1/2001 | Nakano et al. | 524/862 |
| 6,197,859 B1 | 3/2001 | Green et al. | 524/270 |
| 6,286,212 B1 | 9/2001 | Eaton | 29/890.03 |
| 6,399,209 B1 | 6/2002 | Misra et al. | 428/447 |
| 6,605,238 B1 * | 8/2003 | Nguyen et al. | 252/502 |
| 6,620,515 B1 * | 9/2003 | Feng et al. | 428/447 |

FOREIGN PATENT DOCUMENTS

| | | |
|---|---|---|
| EP | 0987757 A2 | 3/2000 |
| EP | 1067164 A1 | 1/2001 |
| JP | 2000-327917 | 11/2000 |
| JP | 2000327917 A * | 11/2000 |
| JP | 2002-329989 A | 11/2002 |

OTHER PUBLICATIONS

"Handbook of Fillers, second edition", George Wypych, 2000, Chem Tec Publishing, Yorondo, Ontario, Chapter 6, pp. 312–320.*
ITherm abstract submission, "Silicone Organic Phase Change Materials for TIM", Mark Zhang, Diane Swarthout, Jane Feng.
ITherm abstract submission, "Novel Silicone Based Phase Change Thermal Interface Materials". Dorab E. Bhagwagar, Kimmai T. Nguyen and Andrew A. Mojica.
Thermal Trends, "Parameter Optimization for Measuring Thermal Properties of Electronic Materials Using the Transient Plane Source Technique", Craig D. Dixon, Michael R. Strong and S. Mark Zhang, vol. 7, No. 5, p. 1, 2000.
American Chemical Society, "Effect of Stabilization of Polypropylene During Processing and Its Influence on Long-Term Behavior Under Thermal Stress", Han Sweifel, p. 376–396, 1996.
"Handbook of Fillers, second edition", George Wypych, 2000, Chem Tec Publishing , Toronto, Ontario, Chapter 6, pp. 312, 318.

* cited by examiner

*Primary Examiner*—Margaret G. Moore
*Assistant Examiner*—Marc S. Zimmer
(74) *Attorney, Agent, or Firm*—Catherine U. Brown (57) ABSTRACT

A phase change composition comprises: a matrix comprising an organofunctional silicone wax, and a thermally conductive filler. The composition can be used as a thermal interface material in electronic devices. The composition is formulated to have any desired phase change temperature.

51 Claims, 2 Drawing Sheets

THERMALLY CONDUCTIVE PHASE CHANGE MATERIALS

CROSS REFERENCE TO RELATED APPLICATIONS

This application is a continuation in part of U.S. patent application Ser. No. 10/021,964 filed on Dec. 14, 2001, now U.S. Pat. No. 6,620,515. This application claims priority to U.S. patent application Ser. No. 10/021,964 under 35 U.S.C. §120.

FIELD OF THE INVENTION

This invention relates to a thermally conductive phase change composition (PCC) and methods for preparation and use of the PCC. More particularly, this invention relates to a PCC comprising an organofunctional silicone wax and a thermally conductive filler. The PCC can be used as a thermal interface material (TIM).

BACKGROUND

Electronic components such as semiconductors, transistors, integrated circuits (ICs), discrete devices, and others known in the art are designed to operate at a normal operating temperature or within a normal operating temperature range. However, the operation of an electronic component generates heat. If sufficient heat is not removed, the electronic component will operate at a temperature significantly above its normal operating temperature. Excessive temperatures can adversely affect performance of the electronic component and operation of the device associated therewith and negatively impact mean time between failures.

To avoid these problems, heat can be removed by thermal conduction from the electronic component to a heat sink. The heat sink can then be cooled by any convenient means such as convection or radiation techniques. During thermal conduction, heat can be transferred from the electronic component to the heat sink by surface contact between the electronic component and the heat sink or by contact of the electronic component and heat sink with a TIM. The lower the thermal impedance of the medium, the greater the flow of heat from the electronic component to the heat sink.

Surfaces of the electronic component and the heat sink are typically not completely smooth, therefore, it is difficult to achieve full contact between the surfaces. Air spaces, which are poor thermal conductors, appear between the surfaces and increase impedance. These spaces can be filled by inserting a TIM between the surfaces.

Some commercially available TIMs are organic polymers or elastomers filled with thermally conductive fillers. However, elastomers suffer from the drawbacks that they may be difficult to apply in an uncured state, and they may not fully adhere or mesh with the surfaces if cured before application. Polymers suffer from the drawback that they can flow out of the spaces after application. Some polymers may also suffer from the drawback that they lack sufficient thermal conductivity.

Silicone greases with conductive fillers have also been proposed as TIMs. However, greases suffer from the drawbacks that they can be messy to apply and can flow out of the spaces after application.

PCCs have been proposed for use as TIMs. PCCs are advantageous in solving the above problems because they can be formulated to be a solid at low temperatures and deformable at a phase change temperature. The phase change temperature can be equal to or above the normal operating temperature of the electronic component.

PCCs can comprise organic materials such as waxes, and conductive fillers. However, organic waxes suffer from the drawback that they can flow out of the spaces after application, during operation of the electronic component. Organic waxes may also be brittle at room temperature.

SUMMARY OF THE INVENTION

This invention relates to a phase change composition (PCC) and methods for its preparation and use. The PCC comprises a matrix and a thermally conductive filler. The matrix comprises an organofunctional silicone wax.

DETAILED DESCRIPTION OF THE PREFERRED EMBODIMENTS

All amounts, ratios, and percentages are by weight unless otherwise indicated. The following is a list of definitions, as used herein.

Definitions and Usage of Terms

"A" and "an" each mean one or more.

"Alkyl" means a saturated hydrocarbon group.

"Combination" means two or more items put together by any method.

"Hydrocarbon group" means a linear or cyclic chain of carbon atoms having hydrogen atoms bonded thereto. Hydrocarbon groups may be branched or unbranched. Hydrocarbon groups may be saturated or unsaturated.

"Organofunctional silicone wax" means a material having at least one ≡Si—O—Si≡ linkage and having at least one organic waxy group bonded to Si.

"Phase change temperature" means a temperature or temperature range evidencing a transition from a solid, crystalline, or glassy phase to a semi-solid phase, which can be characterized as exhibiting intermolecular chain rotation.

"Siloxane" and "silicone" are used synonymously herein.

"Substituted" means one or more hydrogen atoms bonded to a carbon atom has been replaced with another substituent.

"Surface treated" means that all, or a portion of, reactive groups on a filler particle have been rendered unreactive by any convenient chemical or unreactive means.

PCC

This invention relates to a phase change composition. The PCC comprises:

A) a matrix comprising an organofunctional silicone wax,

B) a thermally conductive filler, optionally C) a treating agent, optionally D) an antioxidant, and optionally E) an inhibitor.

The PCC is formulated to have a phase change temperature.

Matrix

Component A) is a matrix that binds the components in the PCC. Component A) comprises an organofunctional silicone wax. The PCC can comprise at least about 4%, alternatively at least about 5% of component A). The PCC can comprise up to about 10% of component A). Organofunctional silicone waxes are known in the art and commercially available. Component A) can comprise an uncrosslinked organofunctional silicone wax, a crosslinked organofunctional silicone wax, or a combination thereof.

Uncrosslinked organofunctional silicone waxes can have the formula:

$R^2R^3{}_2SiO(R^3{}_2SiO)_y(R^3R^1SiO)_zSiR^3{}_2R^2$.

Each $R^1$ is independently an organic waxy group such as a substituted or unsubstituted monovalent hydrocarbon group of at least about 16 carbon atoms, alternatively at least about 20 carbon atoms, alternatively at least about 24 carbon atoms, alternatively at least about 26 carbon atoms. The maximum number of carbon atoms is not specifically restricted and may be higher than about 30 carbon atoms.

As described in U.S. Pat. No. 5,380,527 (col. 3, lines 10–57), the uncrosslinked organofunctional silicone wax can be prepared by reacting a commercially available organosiloxane having silicon-bonded hydrogen atoms (such as trimethylsiloxy-terminated, dimethyl, methyl hydrogen siloxane) with a slight stoichiometric excess of an olefin in the presence of a transition metal (e.g., platinum) catalyst. The number of carbon atoms in the olefin will determine the number of carbon atoms in $R^1$. Olefins are known in the art and commercially available. Mixtures of olefins having different numbers of carbon atoms can be used, for example mixtures of olefins having 30 carbon atoms and olefins having greater than 30 carbon atoms can be used to prepare the uncrosslinked organofunctional silicone wax. For example, the olefin can be GULFTENE® C30+ or GULFTENE® C24/C28, which are mixtures of olefins commercially available from Chevron Phillips Chemical Co., U.S.A. GULFTENE® C30+ comprises a mixture of branched and linear 1-alkenes having about 24 to about 54 carbon atoms, with an average of about 34 carbon atoms. GULFTENE® C24/28 comprises a mixture of 1-alkenes having about 24 to about 28 carbon atoms. The olefin can comprise a mixture of 1-triacontene, 1-dotriacontene, 1-hexacosene, 1-octacosene, 1-tetratriacontene, and alpha-alkenes having greater than 10 carbon atoms. The olefin can comprise a mixture of 1-triacontene, 1-alkenes having about 24 to about 28 carbon atoms, and 2-ethyl-tetracosene. When a mixture of olefins is used, different instances of $R^1$ will have differing numbers of carbon atoms. The olefin or mixture of olefins can be selected to provide $R^1$ groups of a desired number of carbon atoms. One skilled in the art would be able to prepare uncrosslinked organofunctional siloxane waxes without undue experimentation.

The monovalent hydrocarbon group for $R^1$ may be branched or unbranched, saturated or unsaturated, and unsubstituted. Alternatively, the monovalent hydrocarbon group for $R^1$ can be unbranched, saturated, and unsubstituted.

$R^1$ is exemplified by $C_{20}H_{41}$, $C_{21}H_{43}$, $C_{22}H_{45}$, $C_{23}H_{47}$, $C_{24}H_{49}$, $C_{25}H_{51}$, $C_{26}H_{53}$, $C_{27}H_{55}$, $C_{28}H_{57}$, $C_{29}H_{59}$, $C_{30}H_{61}$, $C_{31}H_{63}$, $C_{32}H_{65}$, $C_{33}H_{67}$, $C_{34}H_{69}$, $C_{35}H_{71}$, $C_{36}H_{73}$, $C_{37}H_{75}$, $C_{38}H_{77}$, $C_{39}H_{79}$, $C_{40}H_{81}$, a combination thereof, and others. Alternatively, $R^1$ can be eicosyl, heneicosyl, docosyl, tricosyl, tetracosyl, pentacosyl, hexacosyl, heptacosyl, octacosyl, nonacosyl, triacontyl, hentriacontyl, dotriacontyl, tritriacontyl, tetracontyl, pentacontyl, hexacontyl, heptacontyl, octacontyl, nonacontyl, hectacontyl, or a combination thereof. Alternatively, $R^1$ can be $C_{20}H_{41}$, $C_{22}H_{45}$, $C_{24}H_{49}$, $C_{26}H_{53}$, $C_{28}H_{57}$, $C_{30}H_{61}$, $C_{32}H_{65}$, $C_{34}H_{69}$, $C_{36}H_{73}$, $C_{38}H_{77}$, $C_{40}H_{81}$, or a combination thereof. Alternatively, $R^1$ can be eicosyl, docosyl, tetracosyl, hexacosyl, octacosyl, triacontyl, dotriacontyl, tetracontyl, pentacontyl, hexacontyl, heptacontyl, octacontyl, nonacontyl, hectacontyl, or a combination thereof.

Without wishing to be bound by theory, it is thought that the number of carbon atoms in $R^1$ will affect the phase change temperature of the PCC. Generally, the higher the number of carbon atoms, the higher the phase change temperature. To formulate a PCC with a phase change temperature of about 60° C. or higher, it is thought that at least a portion of the $R^1$ groups in the organofunctional silicone wax have at least about 20 carbon atoms. To formulate a PCC with a phase change temperature of about 75° C. or higher, it is thought that at least a portion of the $R^1$ groups in the organofunctional silicone wax have at least about 30 carbon atoms. For example, a PCC made with GULFTENE® C30+ can have a phase change temperature of about 75° C.

Each $R^2$ is independently an organic group such as a substituted or unsubstituted monovalent hydrocarbon group of at least about 1 carbon atom. $R^2$ can be $R^1$ or $R^3$. The monovalent hydrocarbon group for $R^2$ may be branched or unbranched, saturated, and unsubstituted. Alternatively, the monovalent hydrocarbon group for $R^2$ can be unbranched, saturated, and unsubstituted. $R^2$ is exemplifed by substituted and unsubstituted alkyl groups, substituted and unsubstituted aromatic groups, a combination thereof, and others. $R^2$ can be an unsubstituted alkyl group such as methyl, ethyl, propyl, or butyl.

Each $R^3$ is independently an organic group such as a substituted or unsubstituted monovalent hydrocarbon group of at least about 1 carbon atom and up to about 6 carbon atoms. $R^3$ can be branched, unbranched, or cyclic. Cyclic groups for $R^3$ include phenyl groups. The monovalent hydrocarbon group for $R^3$ may be branched or unbranched, saturated or unsaturated, and unsubstituted. Alternatively, the monovalent hydrocarbon group for $R^3$ can be unbranched, saturated, and unsubstituted. $R^3$ can be an unsubstituted alkyl group such as methyl, ethyl, propyl, or butyl.

In the formula above, y is 0 to about 200, and z is about 1 to about 200. Without wishing to be bound by theory, it is thought that the values of y and z will affect the viscosity of the PCC.

In the formula above, each $R^1$ can independently be a monovalent hydrocarbon group of at least about 16 carbon atoms, alternatively at least about 24 carbon atoms, each $R^2$ can be a methyl group, and each $R^3$ can be a methyl group. The uncrosslinked organofunctional silicone wax can comprise
$(CH_3)_3SiO((CH_3)_2SiO)_3((CH_3)C_{24}H_{49}SiO)_5Si(CH_3)_3$,
$(CH_3)_3SiO((CH_3)_2SiO)_{70}((CH_3)C_{30}H_{61}SiO)_{30}Si(CH_3)_3$, or a combination thereof.

Uncrosslinked silicone waxes may be cyclic. Suitable cyclic uncrosslinked organofunctional silicone waxes can have the formula: $(R^3{}_2SiO)_m(R^3R^1SiO)_n$, where $R^1$ and $R^3$ are as described above. In this formula, m is greater than or equal to 0, n is greater than or equal to 1; with the proviso that m+n is about 1 to about 8, alternatively about 3 to about 6. A combination of a cyclic uncrosslinked silicone wax and a noncyclic uncrosslinked silicone wax can be used in component A).

Component A) can comprise a crosslinked organofunctional silicone wax. The crosslinked organofunctional silicone wax can comprise a reaction product of a siloxane having silicon-bonded hydrogen atoms or an organosiloxane having silicon-bonded hydrogen atoms, an alpha-olefin, and a crosslinker, in the presence of a transition metal catalyst. Crosslinked organofunctional waxes are known in the art and commercially available.

U.S. Pat. No. 5,493,041 discloses crosslinked organofunctional siloxane waxes and methods for their preparation. For example, the crosslinked organofunctional silicone wax can be prepared by reacting a commercially available siloxane having silicon-bonded hydrogen atoms with a slight stoichiometric excess of an olefin and an unconjugated alpha, omega-diene crosslinker in the presence of a transition metal (e.g., platinum) catalyst. Olefins are known in the art and commercially available. Mixtures of olefins having different numbers of carbon atoms can be used, for example mixtures of olefins having 30 carbon atoms and olefins having greater than 30 carbon atoms can be used to prepare the crosslinked organofunctional silicone wax. The crosslinker can be an organic group, an organosilicone having an average of at least two alkenyl groups bonded to silicon atoms per molecule, a combination thereof, and others. One skilled in the art would be able to prepare crosslinked organofunctional siloxane waxes without undue experimentation.

Filler

Component B) is a thermally conductive filler. Component B) is dispersed in component A). The amount of component B) in the PCC depends various factors including the material selected for component A), the material selected for component B), and the desired phase change temperature of the PCC. The amount of component B) can be at least about 90% of the PCC, alternatively at least about 92% of the PCC. The amount of component B) can be up to about 96%, alternatively up to about 95% of the PCC. If the amount of component B) is too low, the PCC may have insufficient thermal conductivity for some applications.

Component B) can be thermally conductive, electrically conductive, or both. Alternatively, component B) can be thermally conductive and electrically insulating. Suitable thermally conductive fillers for component B) include metal particles, metal oxide particles, and a combination thereof. Suitable thermally conductive fillers for component B) are exemplified by aluminum nitride; aluminum oxide; barium titinate; beryllium oxide; boron nitride; diamond; graphite; magnesium oxide; metal particulate such as copper, gold, nickel, or silver; silicon carbide; tungsten carbide; zinc oxide, a combination thereof, and others.

Thermally conductive fillers are known in the art and commercially available, see for example, U.S. Pat. No. 6,169,142 (col. 4, lines 7–33). For example, CB-A20S and Al-43-Me are aluminum oxide fillers of differing particle sizes commercially available from Showa-Denko, and AA-04, AA-2, and AA18 are aluminum oxide fillers commercially available from Sumitomo Chemical Company.

Silver filler is commercially available from Metalor Technologies U.S.A. Corp. of Attleboro, Mass., U.S.A.

The shape of the filler particles is not specifically restricted, however, rounded or spherical particles may prevent viscosity increase to an undesirable level upon high loading of the filler in the PCC.

A combination of fillers having differing particle sizes and different particle size distributions may be used as component B). For example, it may be desirable to combine a first aluminum oxide having a larger average particle size with a second aluminum oxide having a smaller average particle size in a proportion meeting the closest packing theory distribution curve. This improves packing efficiency and may reduce viscosity and enhance heat transfer.

The average particle size of the filler will depend on various factors including the type of filler selected for component B) and the exact amount added to the PCC, however, the filler can have an average particle size of at least about 0.2, alternatively at least about 2. The filler can have an average particle size of up to about 80 micrometers, alternatively up to about 50 micrometers.

The filler for component B) may optionally be surface treated. Treating agents and treating methods are known in the art, see for example, U.S. Pat. No. 6,169,142 (col. 4, line 42 to col. 5, line 2). The PCC may comprise at least about 0.05% of C) a treating agent. The PCC may comprise up to about 10%, alternatively up to about 5%, alternatively up to about 0.5%, of a C) treating agent.

The treating agent can be an alkoxysilane having the formula: $R^5_x Si(OR^6)_{(4-x)}$, where x is 1, 2, or 3; alternatively x is 3. $R^5$ is a substituted or unsubstituted monovalent hydrocarbon group of at least about 1 carbon atom, alternatively at least about 8 carbon atoms. $R^5$ has up to about 50 carbon atoms, alternatively up to about 30 carbon atoms, alternatively up to about 18 carbon atoms. $R^5$ is exemplified by alkyl groups such as hexyl, octyl, dodecyl, tetradecyl, hexadecyl, and octadecyl; and aromatic groups such as benzyl and phenylethyl. $R^5$ can be saturated or unsaturated, branched or unbranched, and unsubstituted. $R^5$ can be saturated, unbranched, and unsubstituted.

$R^6$ is an unsubstituted, saturated hydrocarbon group of at least about 1 carbon atom. $R^6$ may have up to about 4 carbon atoms, alternatively up to about 2 carbon atoms. Component C) is exemplified by hexyltrimethoxysilane, octyltriethoxysilane, decyltrimethoxysilane, dodecyltrimethyoxysilane, tetradecyltrimethoxysilane, phenylethyltrimethoxysilane, octadecyltrimethoxysilane, octadecyltriethoxysilane, a combination thereof, and others.

Alkoxy-functional oligosiloxanes can also be used as treatment agents. Alkoxy-functional oligosiloxanes and methods for their preparation are known in the art, see for example, EP 1 101 167 A2. For example, suitable alkoxy-functional oligosiloxanes include those of the formula $(R^6O)_a Si(OSiR^7_2 R^8)_{4-a}$. In this formula, a is 1, 3, or 3, alternatively a is 3. Each $R^6$ can be an alkyl group. Each $R^7$ is can be independently selected from unsaturated monovalent hydrocarbon groups of about 1 to about 10 carbon atoms. Each $R^8$ can be an unsaturated monovalent hydrocarbon group having at least about 11 carbon atoms.

Metal fillers can be treated with alkylthiols such as octadecyl mercaptan and others, and fatty acids such as oleic acid, stearic acid, a combination thereof, and others.

Treatment agents for alumina or passivated aluminum nitride could include alkoxysilyl functional alkylmethyl polysiloxanes (e.g., partial hydrolysis condensate of $R^9_b R^{10}_c Si(O^{11})_{(4-b-c)}$ or cohydrolysis condensates or mixtures), similar materials where the hydrolyzable group would be silazane, acyloxy or oximo. In all of these, a group tethered to Si, such as $R^9$ in the formula above, is a long chain unsaturated monovalent hydrocarbon or monovalent aromatic-functional hydrocarbon. $R^{10}$ is a monovalent hydrocarbon group, and $R^{11}$ is a monovalent hydrocarbon group of about 1 to about 4 carbon atoms. In the formula above, b is 1, 2, or 3 and c is 0, 1, or 2, with the proviso that b+c is 1, 2, or 3. One skilled in the art could optimize a specific treatment to aid dispersion of the filler without undue experimentation.

Other Optional Components

Component B), the thermally conductive filler, may optionally comprise a reinforcing filler in addition to the thermally conductive filler, or instead of a portion of the thermally conductive filler. The reinforcing filler can be a chopped fiber, such as chopped KEVLAR®. Without wishing to be bound by theory, it is thought that chopped KEVLAR® improves strength and coefficient of thermal expansion (CTE). Reinforcing fillers may also be treated with component C).

Optional component D) is an antioxidant. Without wishing to be bound by theory, it is thought that component D) prevents chain cleavage of the organofunctional silicone wax. Component D) can comprise any antioxidant commonly used in plastics such as polypropylene. Component D) can be added to the PCC in an amount of at least about 0.001%, alternatively at least about 0.05% up to about 1%.

Suitable antioxidants are known in the art and commercially available. Suitable antioxidants include phenolic antioxidants and combinations of phenolic antioxidants with stabilizers. Phenolic antioxidants include fully sterically hindered phenols and partially hindered phenols. Stabilizers include organophosphorous derivatives such as trivalent organophosphorous compound, phosphites, phosphonates, and a combination thereof; thiosynergists such as organosulfur compounds including sulfides, dialkyldithiocarbamate, dithiodipropionates, and a combination thereof; and sterically hindered amines such as tetramethyl-piperidine derivatives. Suitable antioxidants and stabilizers are disclosed in Zweifel, Hans, "Effect of Stabilization of Polypropylene During Processing and Its Influence on Long-Term Behavior under Thermal Stress," *Polymer Durability*, Ciba-Geigy AG, Additives Division, CH-4002, Basel, Switzerland, American Chemical Society, vol. 25, pp. 375–396, 1996.

Suitable phenolic antioxidants include vitamin E and IRGANOX® 1010 from Ciba Specialty Chemicals, U.S.A. IRGANOX® 1010 comprises pentaerythriol tetrakis(3-(3,5-di-t-butyl-4-hydroxyphenyl)propionate).

Optional component E) is a catalyst inhibitor. Component E) can be an addition reaction catalyst inhibitor. Addition reaction catalyst inhibitors are known in the art and commercially available, see for example, U.S. Pat. No. 5,929,164 (col. 1, line 65 to col. 3, line 65). Without wishing to be bound by theory, it is thought that the catalyst inhibitor prevents crosslinking of uncrosslinked organofunctional silicone waxes and further crosslinking of crosslinked organofunctional silicone waxes.

Component E) can be a phosphine, a diphosphine, an amine, a diamine, a triamine, an organic sulfide, an alkenyl-functional compound, an alkynyl-functional compound, a hydroxy-functional compound, a combination thereof, or any other transition metal catalyst poison.

Suitable phosphines include trialkyl phosphines and triaryl phosphines such as triphenyl phosphine. Suitable diphosphines include tetraphenylethylene diphosphine. Suitable amines include n-butyl amine and triethanolamine. Suitable diamines include tetramethylenediamine. Suitable organic sulfides include ethyl phenyl sulfide. Suitable alkenyl-functional compounds can be organic, organosilicones, or organosilanes. Suitable alkenyl-functional compounds include vinylsiloxanes and vinylsilanes. Suitable alkynyl functional compounds can be organic, such as acetylene, propyne, 1-butyne, 1-pentyne, 4,4-dimethyl-1-pentyne, 1-hexyne, 5-methyl-1-hexyne, and 1-decyne.

Component E) is added in an amount sufficient to provide mechanical and chemical stability to the PCC for a period of at least about 7 years when the PCC is to be used in a central processing unit (CPU) device. The amount of component E) can be at least about 0.001%. The amount of component E) can be up to about 1%.

Component F) is an optional matrix material that can be added in addition to component A) or instead of a portion of component A). Component F) can comprise an organic wax, such as a Fischer-Tropsh wax, a polymer compatible with the organofunctional silicone wax, a hardener, a combination thereof, and others. Organic waxes are known in the art and commercially available.

Component G) is a vehicle such as a solvent or diluent. Component G) can be added during preparation of the PCC, for example, to aid mixing and delivery. All or a portion of component G) may optionally be removed after the PCC is prepared.

Component H) is a wetting agent.

Component I) is an opacifying agent.

Component J) is an antifoaming agent.

Component K) is a pigment. Examples of suitable pigments include Stan-Tone 50SP01 Green (which is commercially available from PolyOne).

Component L) is a flame retardant.

Component M) is a spacer. Spacers can comprise organic particles, inorganic particles, or a combination thereof. Spacers can be thermally conductive, electrically conductive, or both. Spacers can have a particle size of at least about 25 micrometers up to about 250 micrometers. Spacers can comprise monodisperse beads. The amount of component M) depends on various factors including the distribution of particles, pressure to be applied during placement, temperature of placement, and others. The PCC can contain up to about 15%, alternatively up to about 5% of component M) added in addition to, or instead of, a portion of component B).

Component N) is a low melting metal. Component N) may comprise Ga, In, Sn, or an alloy thereof. The low melting metal may optionally further comprise Ag, Bi, Cd, Cu, Pb, Zn, or a combination thereof. Examples of suitable low melting metals include Ga, In—Bi—Sn alloys, Sn—In—Zn alloys, Sn—In—Ag alloys, Sn—Ag—Bi alloys, Sn—Bi—Cu—Ag alloys, Sn—Ag—Cu—Sb alloys, Sn—Ag—Cu alloys, Sn—Ag alloys, Sn—Ag—Cu—Zn alloys, and combinations thereof. The low melting metal can have a melting point of up to 250° C., alternatively up to 225° C. The low melting metal can have a melting point of at least 50° C., alternatively at least 150° C. The low melting metal can be a eutectic alloy, a non-eutectic alloy, or a pure metal. Low melting metals are commercially available. The low melting metal may comprise at least about 1 up to about 20% of the weight of the PCC, alternatively at least about 13% up to about 14% percent based on the weight of the PCC.

Method of Preparation of the PCC

Component A) is selected such that the PCC will be solid below its phase change temperature and deformable at or above the phase change temperature. The phase change temperature can be selected depending on various factors including the use of the PCC.

For example, the PCC can be used as a TIM in an electronic device. In this instance, the phase change temperature can be equal to or slightly less than the normal operating temperature for some electronic devices, e.g., at least about 40° C., alternatively at least about 45° C., alternatively at least about 50° C., alternatively at least about 55° C., alternatively at least about 60° C. The normal operating temperature can be up to about 80° C., alternatively up to about 90° C., alternatively up to about 100° C. Alternatively, the phase change temperature can be the maximum temperature the electronic devices can withstand, e.g., at least about 125° C. up to about 150° C. for some electronic devices.

The phase change temperature can be controlled by varying a number of factors such as the number of carbon atoms in $R^1$ for the uncrosslinked organofunctional silicone waxes and the number of carbon atoms in the olefin and the amount of crosslinker used to prepare the crosslinked organofunctional silicone waxes, the ratio of non-SiH containing units to SiH containing units ($D/D^{(H)}$ ratio) in the organosiloxane having silicon bonded hydrogen atoms used to prepare the organofunctional silicone wax, and the degree of polymerization of the organofunctional silicone wax. A person of ordinary skill in the art would be able to select component A) to provide a desired phase change temperature without undue experimentation.

The PCC can be formulated to have a thermal conductivity of at least about 3 Watts per meter Kelvin (W/mK), alternatively at least about 5 W/mK. Thermal conductivity depends on various factors including the amount and type of filler selected for component B).

The PCC can be prepared by any convenient means, such as mixing all components at a temperature higher than the phase change temperature. For example, for PCCs having a phase change temperature of up to 90° C., the PCC can be prepared by mixing all components at 100° C.

When component C) is present, the PCC may optionally be prepared by surface treating component B) with component C) and thereafter mixing the PCC at a temperature above the phase change temperature. Alternatively, component C) may be mixed with some or all of the other components simultaneously at a temperature above the phase change temperature.

When component G) is present, the PCC can be prepared by mixing all components at ambient or elevated temperature.

When component N) is present, the PCC can be prepared by mixing all components at ambient or elevated temperature. Alternatively, the PCC can be prepared by mixing all components except component N) at ambient or elevated temperature and subsequently mixing component N). Alternatively, the PCC can be prepared by mixing component B) with component N) prior to mixing with the remaining component or components.

Methods of Use

The PCC described above can be used as an interface material, such as a thermal interface material (TIM). The interface material may have any convenient configuration, and one skilled in the art would be able to control the configuration by appropriate selection of component A), and other variables. The PCC can be formulated to be form stable under ambient conditions. The PCC can be formulated to be self-supporting under ambient conditions. The PCC may optionally be provided as a flat member, such as a pad, tablet, sheet, or tape. Alternatively, the PCC may be provided as a hemispherical nubbin, a convex member, a pyramid, or a cone. The PCC may be formulated to be a tacky or tack-free solid under ambient conditions.

The PCC may optionally have a removable release sheet over a surface of the PCC. A release sheet can be used when the PCC is tacky at ambient conditions. The release sheet can be, for example, a wax- or silicone-coated paper or plastic sheet having a relatively low surface energy. The PCC may be applied to a face stock, liner, or other release sheet by any conventional means such as a direct process, e.g., spray-coating, knife-coating, roller coating, casting, drum coating, dipping or the like or an indirect transfer process using a release sheet. A solvent, diluent, or other vehicle may be added to the PCC before application, and thereafter the vehicle is removed to leave an adherent film, coating, or residue of the PCC on the release sheet.

Figure 1:
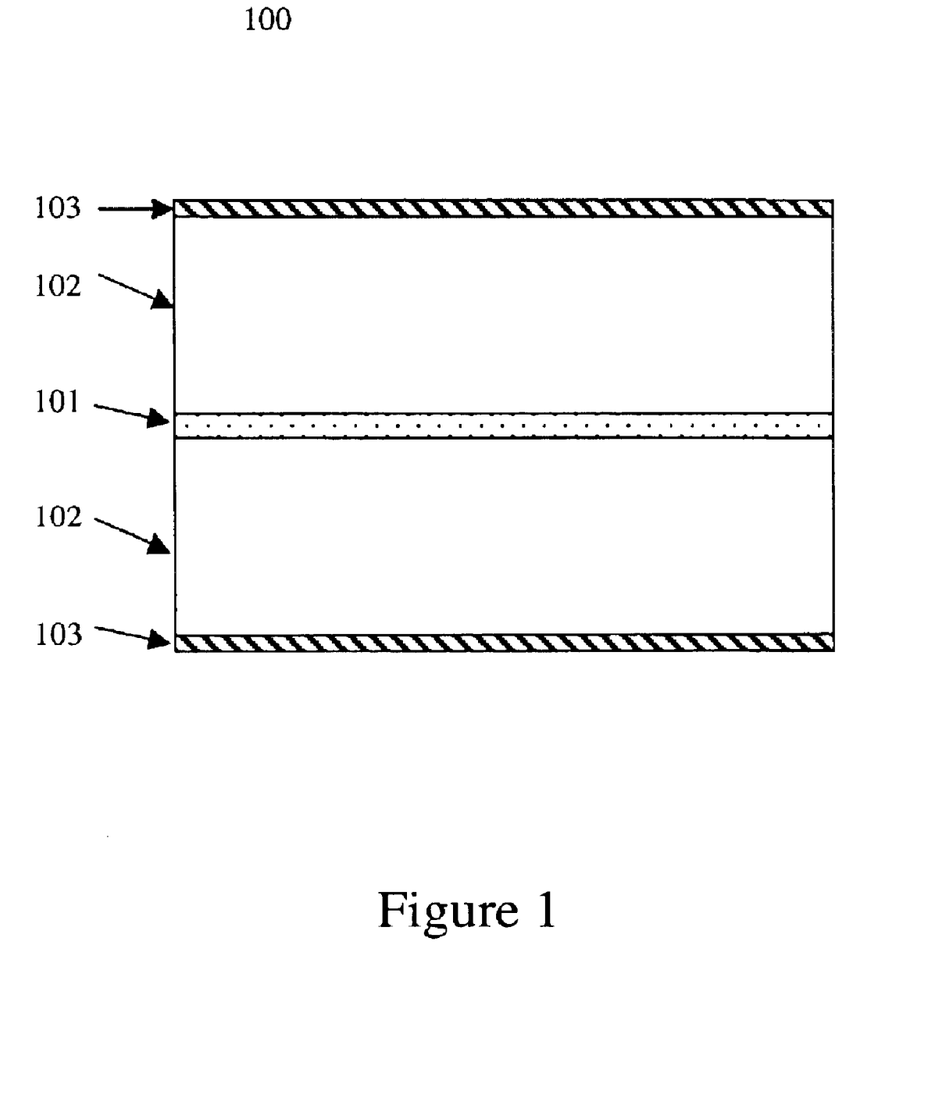
FIG. 1 is an interface material according to this invention.

The PCC may optionally be coated on a substrate, for example, when the PCC lacks sufficient form stability during processing. The substrate can be a thermally conductive material, an electrically conductive material, or both. The substrate can be, for example, a metal foil or perforated metal foil, such as gold, silver, copper, or aluminum foil; polyimide; polyamide; KAPTON® from E. I. Du Pont de Nemours and Company, Inc., of Wilmington, Del., U.S.A.; or polyethylene terephthalate polyester (MYLAR® from E. I. Du Pont de Nemours and Company, Inc., of Wilmington, Del., U.S.A.). The PCC can be coated on one or more surfaces of the substrate. Release sheets may be used on both sides of the coated substrate. This interface material is shown in FIG. 1. In FIG. 1, the interface material 100 comprises a substrate 101, and layers of the PCC described above 102 formed on opposing sides of the substrate 101. Release liners 103 are applied over the exposed surfaces of the PCC 102.

Various interface materials comprising the PCC described above can be prepared. The PCC described above can be used to prepare interface materials by various methods, including those disclosed in U.S. Pat. Nos. 4,299,715 and 5,904,796.

The PCC can be interposed along a thermal path between a heat source and a heat spreader or a heat sink. The PCC can be interposed by any convenient means, such as applying a form stable PCC or interface material comprising the PCC between the heat source and the heat spreader or heat sink with or without an adhesive or primer, hot-melt dispensing the PCC, or solvent casting the PCC.

The heat source can comprise an electronic component such as a semiconductor, a transistor, an integrated circuit, or a discrete device.

The heat spreader can comprise a thermally conductive plate, a thermally conductive cover, a fan, a circulating coolant system, a combination thereof, or others. The PCC can be used in direct contact with the electronic component and the heat spreader (TIM1). The PCC can be applied either to the electronic component and thereafter the heat spreader, or the PCC can be applied to the heat spreader and thereafter to the electronic component. Alternatively, the PCC can be used in direct contact with the heat spreader and a heat sink (TIM2). The PCC can be applied either to the heat sink and thereafter the heat spreader, or the PCC can be applied to the heat spreader and thereafter to the heat sink. Alternatively, the PCC can be used in direct contact with the electronic component and the heat sink. The PCC can be applied either to the electronic component and thereafter the heat sink, or the PCC can be applied to the heat sink and thereafter to the electronic component.

During or after interposing the PCC along the thermal path, the PCC can be heated to a temperature equal to or greater than the phase change temperature. Pressure may be applied. The PCC can then be cooled.

This invention further relates to a product comprising:
 a) an electronic component,
 b) an interface material, and
 c) a heat sink;
where the interface material is arranged along a thermal path extending from a surface of the electronic component to a surface of the heat sink, where the interface material comprises the PCC described above.

This invention further relates to a product comprising:
a) a heat spreader, and
b) an interface material on a surface of the heat spreader, where the interface material and the heat spreader are configured to comprise a portion of a thermally conductive path between an electronic component and a heat sink, and where the interface material comprises the PCC described above.

The product may further comprise c) a heat sink, wherein the interface material contacts a surface of the heat sink. Alternatively, the interface material may contact the electronic component.

Figure 2:
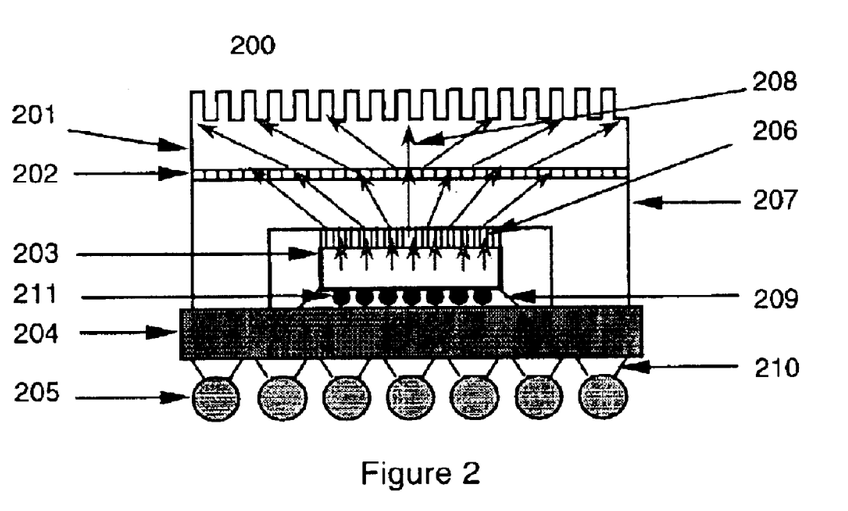
FIG. 2 is a device according to this invention.

FIG. 2 shows a device 200 according to this invention. The device 200 comprises an electronic component (shown as an integrated circuit (IC) chip) 203 mounted to a substrate 204 through a die attach adhesive 209. The substrate 204 has solder balls 205 attached thereto through pads 210. A first interface material (TIM1) 206 is interposed between the IC chip 203 and a metal cover 207. The metal cover 207 acts as a heat spreader. A second interface material (TIM2) 202 is interposed between the metal cover 207 and a heat sink 201. Heat moves along a thermal path represented by arrows 208 when the device is operated.

Products and devices may be prepared including the PCC described above. For example, the PCC described above may be used as the thermally conductive interface materials in the devices disclosed in U.S. Pat. Nos. 5,912,805; 5,930,893; 5,950,066; 6,054,198; and 6,286,212 in addition to, or instead of, the interface materials described therein.

EXAMPLES

These examples are intended to illustrate the invention to one skilled in the art and should not be interpreted as limiting the scope of the invention set forth in the claims. In the examples below, Me represents a methyl group.

Reference Example 1

Mathis Hotdisk Method

Thermal conductivity measurement of the phase change materials is carried out on the Mathis Hotdisk equipment. Technical details of the method can be found in the instrument menu from the Mathis Instrument LTD. The technique can also be found in a publication by Craig Dixon, Michael Strong, and S. Mark Zhang, *Thermal Trends*, Vol. 7, No. 5, page 1.

Example 1

PCC with Uncrosslinked Silicone Wax

An uncrosslinked alkyl methyl silicone wax is prepared from C30+ alpha-olefin (Chevron Phillips Chemical Company) and $Me_3SiO(SiHMeO)_{10}SiMe_3$.

In a 5 ounce cup, 7.5 grams (g) of the uncrosslinked alkyl methyl silicone wax and 0.5 g octadecyltrimethoxysilane (from Gelest, Inc.) are heated up to 100° C. In a separate container, 130 g $Al_2O_3$ filler mixture is heated to 100° C. The $Al_2O_3$ filler mixture is a 1:1 mixture of CB-A20S and Al-43-Me aluminum oxide fillers from Showa-Denko K. K. The $Al_2O_3$ filler mixture is gradually added into the cup, and the PCC is mixed with a Hauschild centrifugal mixer.

During the whole filler addition and mixing process, the temperature of the PCC is maintained above approximately 90° C. Below 75° C., the PCC is a solid, but above that temperature, the PCC is a viscous creamy material. The viscosity of the PCC is measured on a Rheometric Rheometer and depends on the shear rate. At 90° C., the PCC has a viscosity of $1.9 \times 10^4$ poise at 0.5 l/s. The PCC is then loaded in between a Mathis hotdisk thermal sensor, and its thermal conductivity at 100° C. is be 5.5 Watts per meter Kelvin (W/mK).

Example 2

PCC with Crosslinked Silicone Wax

A lightly crosslinked alkyl methyl silicone wax is made from the $C_{26-28}$ alpha-olefin (Chevron Phillips Chemical Company), $Me_3SiO(SiHMeO)_{39}(SiMe_2O)_{16}SiMe_3$, and $(Hexenyl)Me_2SiO(SiMe_2O)_{100}SiMe_2(Hexenyl)$.

In a 5 ounce cup, 7.5 grams (g) of the wax and 0.5 g octadecyltrimethoxysilane (from Gelest, Inc.) are heated up to 100° C. In a separate container, 100 g $Al_2O_3$ filler mixture are heated to 100° C. The $Al_2O_3$ filler mixture is a 1:1 mixture of CB-A20S and Al-43-Me aluminum oxide fillers from Showa-Denko K. K. The $Al_2O_3$ filler mixture is gradually added into the cup, and the PCC is mixed with a Hauschild centrifugal mixer.

During the whole filler addition and mixing process, the temperature of the PCC is maintained above approximately 90° C. Below 65° C., the PCC is a solid, but above that temperature, the PCC is a viscous creamy material. The viscosity of the PCC can be measured on a Rheometric Rheometer and depends on the shear rate. At 90° C., the PCC has a viscosity of $4.7 \times 10^4$ poise at 0.5 l/s. The PCC is then loaded in between a Mathis hotdisk thermal sensor, and its thermal conductivity at 100° C. is found to be 5 W/mK.

Example 3

PCC with Crosslinked Silicone Wax

A lightly crosslinked methyl alkyl silicone wax is made from the $C_{26-28}$ alpha-olefin (Chevron Phillips Chemical Company), $Me_3SiO(SiHMeO)_{31}(SiMe_2O)_{64}SiMe_3$, and $(Hexenyl)Me_2SiO(SiMe_2O)_{25}SiMe_2(Hexenyl)$.

In a 5 ounce cup, 7.5 grams of the wax, 0.5 g octadecyltrimethoxysilane (from Gelest, Inc.) are melted by heating up to 100° C. In a separate container, 90 g $Al_2O_3$ filler mixture is heated to 100° C. The $Al_2O_3$ filler mixture is a 1:1 mixture of CB-A20S and Al-43-Me aluminum oxide fillers from Showa-Denko K. K. The $Al_2O_3$ filler mixture is gradually added into the cup and the PCC is mixed with a Hauschild centrifugal mixer.

During the whole filler addition and mixing process, the temperature of the PCC is maintained above approximately 90° C. Below 65° C., the PCC is a solid, but above that temperature, the PCC is a viscous creamy material. The viscosity of the PCC is measured on a Rheometric Rheometer depends on the shear rate. At 90° C., the PCC has a viscosity of $1.3 \times 10^4$ poise at 0.5 l/s. The PCC is then loaded in between a Mathis hotdisk thermal sensor, and its thermal conductivity at 100° C. is found to be 3 W/mK.

Example 4

Effect of Antioxidant

A sample is made according to Example 1, except that 70 milligrams of IRGANOX® 1010 (from Ciba Specialty Chemicals) is mixed in the PCC. The sample and the sample from Example 1 are both put into two open glass jars, respectively, then placed in a 125° C. oven. After seven days, a layer of crust has formed on the sample without IRGA- NOX® 1010, but the sample with IRGANOX® 1010 remains as a creamy PCC.

Example 4 shows that stability at high temperatures can be improved by adding an antioxidant to a PCC according to this invention.

Example 5

Effect of Filler Loading

PCCs are prepared using varying amounts of alumina filler, which is a mixture of Showa Denko CB-20S and Al-31-Me at 2:1 weight ratio. The balance of the PCC is an alkyl methyl siloxane wax with phase change temperature at 53° C. The thermal conductivities of each PCC are measured by the Mathis Hotdisk method at 70° C. The filler loadings and thermal conductivities are in Table 1.

TABLE 1

| Sample | Filler Loading (wt %) | Thermal Conductivity (W/mK) |
|---|---|---|
| 5A | 94.4 | 4.53 |
| 5B | 94.2 | 4.44 |
| 5C | 94 | 4.28 |
| 5D | 93.8 | 4.34 |
| 5E | 93.6 | 4.09 |
| 5F | 93 | 3.89 |
| 5G | 92 | 3.64 |
| 5H | 91 | 3.15 |
| 5I | 90 | 2.33 |
| 5J | 88 | 2.08 |
| 5K | 85 | 1.64 |
| 5L | 84 | 1.44 |

As shown in Table 1, above, it appears that the thermal conductivity before reaching 90% filler is relatively low and the change over the filler percentage is small in this example. When the filler wt % reaches 90% and beyond, the thermal conductivity increase dramatically as the filler loading increases in this example. At 85% loading, thermal conductivity is too low for some applications.

Example 6

Effect of Filler Loading

Five phase change compositions are prepared using an uncrosslinked alkyl methyl silicone wax prepared from C30+ alpha-olefin (Chevron Phillips Chemical Company) and $Me_3SiO(SiHMeO)_{10}SiMe_3$ and $Al_2O_3$ filler.

TABLE 2

| Sample | $Al_2O_3$ filler wt % | Wax wt % | Thermal conductivity 80 to 100° C. (W/mK) |
|---|---|---|---|
| 6A | 94.4 | 5.6 | 5.4 |
| 6B | 94.2 | 5.8 | 5.2 |
| 6C | 94 | 6 | 4.7 |
| 6D | 93.7 | 6.3 | 4.1 |
| 6E | 86.7 | 13.3 | 2.0 |

The data in Table 2 show that when $Al_2O_3$ loading is less than 90%, the thermal conductivity of the PCC in this example is significantly reduced. Table 2 shows the trend of the thermal conductivity over wt % of $Al_2O_3$.

Example 7

Viscosity of PCCs as a Function of Alumina Loading

Samples of PCC are prepared using varying amounts of an alumina mixture of Showa Denko CB-20S and Al-31-Me at 2:1 weight ratio. The balance of each sample is an alkyl methyl siloxane wax with phase change temperature at 53° C. The viscosity is measured by ARES Rheometer at 90° C. with steady rate sweep at 1 reciprocal second shear rate. The alumina loading and viscosity are shown in Table 3.

TABLE 3

| Sample | Alumina Loading (wt %) | Viscosity (Poise) |
|---|---|---|
| 7A | 94.4 | 15066 |
| 7B | 94.2 | 12137 |
| 7C | 94 | 9584 |
| 7D | 93.8 | 7950 |
| 7E | 93.6 | 7293 |
| 7F | 93 | 4906 |
| 7G | 92 | 3229 |
| 7H | 91 | 2857 |
| 7I | 85 | 243 |

The data in Table 3 show that when alumina content is below 85%, the viscosity of the PCC may be too low. It is undesirable to have a PCC with an inadequate filler loading and a viscosity that is too low, since the PCC may have insufficient thermal conductivity and may flow out of the device at the operating temperature.

Example 8

Effect of Organofunctional Silicone Wax

Samples of different alkyl methyl siloxane waxes are prepared by reacting an olefin with an organohydrogen siloxane. The organohydrogensiloxane and the number of carbon atoms in the olefin are described in Table 4. The melting point (mp) of each wax is also in Table 4.

TABLE 4

| Alkyl Methyl Siloxane Wax Structure vs mp | | | | |
|---|---|---|---|---|
| Sample No. | Siloxane | $D/D^{(H)}$ | Olefin | mp (° C.) |
| 8A | $MD^{(H)}_{70}M$ | 0 | C20–24 | 55 |
| 8B | $MD_{25}D^{(H)}_6M$ | 4.2 | C26–28 | 51 |
| 8C | $MD_{16}D^{(H)}_{39}M$ | 0.41 | C26–28 | 68 |
| 8D | $MD_{60}D^{(H)}_6M$ | 10 | C30+ | 58 |
| 8E | $MD_{195}D^{(H)}_{63}M$ | 3.1 | C26–28 | 58.5 |
| 8F | $MD^{(H)}_{25}M$ | 0 | C30+ | 76 |

In table 4, M represents a unit of the formula $OSi(CH_3)_3$, D represents a unit of the formula $OSi(CH_3)_2$, and $D^{(H)}$ represents a unit of the formula $OSiH(CH_3)$.

The mp of the alkyl methyl silicone wax is affected by siloxane structure and alpha-olefin chain length, and the degree of polymerization of the alkyl methyl silicone wax. When the siloxane has no D units (i.e., the $D/D^{(H)}$ ratio is 0), hydrocarbon chains are grafted on the siloxane backbone one after another, and the mp of the alkyl methyl silicone waxes are higher than those containing D units. In general, the more D units, the lower the mp of the alkyl methyl silicone wax. Similarly, in general, the higher the $D/D^{(H)}$ ratio, the more siloxane nature of the siloxane wax, and the lower the mp. The $D/D^{(H)}$ ratio may have a value of at least 0, alternatively at least 1, alternatively at least 5. The $D/D^{(H)}$ ratio may have a value up to 100, alternatively up to 10. Without wishing to be bound by theory it is thought that when the $D/D^{(H)}$ ratio is at least 5, the mechanical properties of the PCC may be improved, for example, the PCC may be less brittle than if the $D/D^{(H)}$ ratio is less than 5.

In the PCC formulations in these examples, the matrix affects the phase change temperature. The choice of thermally conductive filler and its percentage in the formulation affect the thermal conductivity of the PCC because the matrices have relatively low thermal conductivities compared to the thermally conductive fillers. The higher the thermally conductive filler loading, the higher the thermal conductivity of a PCC. However, before reaching a threshold level, the impact of the filler loading is small. After reaching the threshold level, a small change of the filler wt % will create a large change in the thermal conductivity. When the filler loading is too high, however, the viscosity of the PCC may be too high, and the PCC may not flow to the thin bond line at the operating temperature as desired, and the PCC may not form an intimate contact to the substrate surface. Therefore, these factors may be balanced to develop a material with as high a thermally conductive filler loading as possible, but still maintaining a flowable viscosity. It is undesirable to have a PCC with an inadequate filler loading and a viscosity that is too low, since the PCC may have insufficient thermal conductivity and may flow out of the device at the operating temperature.

Example 9

Effect of Low Melting Metal in a PCC

Two PCC samples are prepared. Sample 9A does not contain low melting metal and sample 9B contains a low melting metal. An alkylmethylsiloxane wax for samples 9A and 9B is prepared by reacting C30+ alpha-olefin (Chevron Phillips Chemical Company) and $Me_3SiO(SiMe_2O)_{60}(SiHMeO)_7SiMe_3$ to form an alkyl methyl siloxane wax with mp of 53° C.

In a 5 ounce cup, 7.5 grams (g) of the alkyl methyl silicone wax and 0.5 g octadecyltrimethoxysilane (from Gelest, Inc.) and 0.09 gram IRGANOX® 1010 (from Ciba Specialty Chemicals) are heated up to 100° C. In a separate container, 130 g $Al_2O_3$ filler mixture is heated to 100° C. The $Al_2O_3$ filler mixture is a 2:1 mixture of CB-A20S and Al-43-Me aluminum oxide fillers from Showa-Denko K. K. The $Al_2O_3$ filler mixture is gradually added into the cup, and the PCC is mixed with a Hauschild centrifugal mixer. During the filler addition and mixing process, the temperature of the PCC is maintained above about 90° C. This is sample 9A.

Sample 9B is prepared by mixing parts I and II. Part I is prepared by mixing 120 g of a filler mixture (2:1 wt ratio CB-A20S and Al-43-Me aluminum oxide fillers from Showa-Denko K. K) with 20 grams Gallium at about 100° C.

Part II is prepared by mixing 5.84 g of the alkyl methyl siloxane wax (described the above), 0.27 g octadecyltrimethoxysilane (from Gelest, Inc.) and 0.07 gram IRGANOX® 1010 (from Ciba Specialty Chemicals) at about 100° C.

115 grams of Part I is mixed with all of Part II at 75 to 100° C. in a cup by Hauschild centrifugal mixer. The thermal conductivity of the Sample 9B is 4.2 W/mK at 70° C. as measured by the Mathis Hotdisk® method.

Portions of samples 9A and 9B are each coated on an aluminum mesh (35 micron thick, made by Delker) in about 150 micrometer thickness to form samples 9C (without low melting metal) and 9D (with low melting metal). Stud pull test samples are prepared by sandwiching each sample between two nickel coated copper plates to form an assembly, which is clamped with two office clamps that create 7 to 10 psi pressure on the plates. The assemblies are placed in a 75° C. for two hours, and are cooled to room temperature before the stud-pull test. The test results are in Table 5.

TABLE 5

| Material | Stud-pull Test Results | |
| --- | --- | --- |
| | Stud-pull Tension (psi) | STDEV |
| Sample 9A (without mesh, without low melting metal) | 22 | 1 |
| Sample 9C (with mesh, without low melting metal) | 13 | 5 |
| Sample 9D (with mesh, with low melting metal) | 6 | 2 |

Example 9 shows that when a low melting metal is included in the PCC, adhesion to a metal substrate surface may be lowered. Lowering adhesion to metal substrate surfaces is advantageous in some applications where strong adhesion of a TIM between substrates can cause difficulties at rework. Without wishing to be bound by theory, it is thought that the low melting metal provides low adhesion to substrates for ease of rework in PCCs that have good intimate contact for low interfacial resistance.

We claim:

1. A composition comprising:
    A) a matrix comprising an organofunctional silicone wax;
    B) a thermally conductive filler;
    optionally C) a treating agent;
    optionally D) an antioxidant;
    optionally E) an inhibitor;
    optionally F) a matrix material selected from the group consisting of an organic wax, a polymer compatible with the organofunctional silicone wax, a hardener, and a combination thereof;
    optionally G) a vehicle;
    optionally H) a wetting agent;
    optionally I) an opacifying agent;
    optionally J) an antifoaming agent;
    optionally K) a pigment;
    optionally L) a flame retardant;
    optionally M) a spacer,
    N) a low melting metal, and
    optionally O) a reinforcing filler.

2. The composition of claim 1, where component A) is present in an amount of about 4 to about 10% based on the weight of the composition.

3. The composition of claim 1, where the composition is formulated to have a phase change temperature of at least about 40° C.

4. The composition of claim 1, where the organofunctional silicone wax comprises an uncrosslinked organofunctional silicone wax.

5. The composition claim 4, where the uncrosslinked organofunctional silicone wax comprises a wax of the formula $R^2R^3{}_2SiO(R^3{}_2SiO)_y(R^3R^1SiO)_zSiR^3{}_2R^2$, a cyclic wax of the formula $(R^3{}_2SiO)_m(R^3R^1SiO)_n$, or a combination thereof; where
    each $R^1$ is independently a substituted or unsubstituted monovalent hydrocarbon group of at least about 16 carbon atoms,
    each $R^2$ is independently a substituted or unsubstituted monovalent hydrocarbon group,
    each $R^3$ is independently a substituted or unsubstituted monovalent hydrocarbon group of at least about 1 carbon atom up to about 4 carbon atoms, m is greater than or equal to 0, n is greater than or equal to about 1, with the proviso that m+n is up to about 8, y is 0 to about 200, and z is about 1 to about 200.

6. The composition of claim 5, where each $R^1$ is an unsubstituted monovalent hydrocarbon group of at least about 16 carbon atoms, each $R^2$ is a methyl group, and each $R^3$ is a methyl group.

7. The composition of claim 1, where component A) comprises a crosslinked organofunctional silicone wax.

8. The composition of claim 7, where the crosslinked organofunctional silicone wax comprises a reaction on product of
   a) a crosslinking agent comprising an alpha-, omega-diene, an 1-alkenyl-functional organopolysiloxane having at least two 1-alkenyl groups per molecule, or a combination thereof;
   b) an alpha-olefin; and
   c) a siloxane having silicon-bonded hydrogen atoms or an organosiloxane having silicon-bonded hydrogen atoms.

9. The composition of claim 1, where component B) is electrically conductive.

10. The composition of claim 1, where component B) is electrically insulating.

11. The composition of claim 1, where component B) comprises aluminum nitride, aluminum oxide, barium titinate, beryllium oxide, boron nitride, diamond, graphite, magnesium oxide, metal particulate, silicon carbide, tungsten carbide, zinc oxide, or a combination thereof.

12. The composition of claim 1, where component C) is present in an amount of at least about 0.05% up to about 5% based on the weight of the composition.

13. The composition of claim 12, where component C) comprises an alkoxysilane having the formula: $R^5_x Si(OR^6)_{(4-x)}$, where $R^5$ is a substituted or unsubstituted monovalent hydrocarbon group of at least about 1 carbon atoms and up to about 50 carbon atoms, each $R^6$ is independently an unsubstituted, saturated hydrocarbon group of at least about 1 carbon atom and up to about 4 carbon atoms, and x is 1, 2, or 3.

14. The composition of claim 1, where component D) is present in an amount of at least about 0.001% up to about 1% based on the weight of the composition.

15. The composition of claim 1, where component E) is present in an amount of at least about 0.001% up to about 1% based on the weight of the composition.

16. The composition of claim 15, where component E) comprises an addition reaction catalyst inhibitor.

17. An interface material comprising I) the composition of claim 1, where the composition is formed as a flat member, a hemispherical nubbin, a convex member, a pyramid, or a cone.

18. The interface material of claim 17, where further comprising II) a release sheet, where the release sheet covers a surface of the composition.

19. The interface material of claim 17, where the composition is coated on a surface of a substrate.

20. The interface material of claim 19, where the substrate comprises a metal foil, a polyamide sheet, a polyimide sheet, or a polyethylene terephthalate polyester sheet.

21. The interface material of claim 19, further comprising II) a release sheet covering a surface of the composition opposite the substrate.

22. A method comprising:
   i) interposing the composition of claim 1 along a thermal path between a heat source and a heat spreader.

23. The method of claim 22, wherein the heat source comprises an electronic component.

24. The method of claim 22, where the heat spreader comprises a heat sink, a thermally conductive plate, a thermally conductive cover, a fan, or a circulating coolant system.

25. A device comprising:
   a) an electronic component,
   b) an interface material, and
   c) a heat sink;
   where the interface material is arranged along a thermal path extending from a surface of the electronic component to a surface of the heat sink, where the interface material comprises the composition of claim 1.

26. A device comprising:
   a) a heat spreader, and
   b) an interface material on a surface of the heat spreader,
   where the interface material and the heat spreader are configured to comprise a portion of a thermally conductive path between an electronic component and a heat sink, and where the interface material comprises the composition of claim 1.

27. A composition comprising:
   A) a matrix comprising a crosslinked organofunctional silicone wax,
   B) a thermally conductive filler,
   optionally C) a treating agent,
   optionally D) an antioxidant, and
   optionally B) an inhibitor.

28. The composition of claim 27, where the composition is formulated to have a phase change temperature of at least about 40° C.

29. The composition of claim 27, where component B) is electrically conductive.

30. The composition of claim 27, where component B) is electrically insulating.

31. The composition of claim 27, where component B) comprises aluminum nitride, aluminum oxide, barium titinate, beryllium oxide, boron nitride, diamond, graphite, magnesium oxide, metal particulate, silicon carbide, tungsten carbide, zinc oxide, or a combination thereof.

32. The composition of claim 27, where component C) is present in an amount of at least about 0.0 5% up to about 5% based on the weight of the composition.

33. The composition of claim 32, where component C) comprises an alkoxysilane having the formula: $R^5_x Si(OR^6)_{(4-x)}$, where $R^5$ is a substituted or unsubstituted monovalent hydrocarbon group of at least about 1 carbon atoms and up to about 50 carbon atoms, each $R^6$ is independently an unsubstituted, saturated hydrocarbon group of at least about 1 carbon atom and up to about 4 carbon atoms, and x is 1, 2, or 3.

34. The composition of claim 27, where component D) is present in an amount of at least about 0.001% up to about 1% based on the weight of the composition.

35. The composition of claim 27, where component E) is present in an amount of at least about 0.001% up to about 1% based on the weight of the composition.

36. The composition of claim 35, where component E) comprises an addition reaction catalyst inhibitor.

37. The composition of claim 27, further comprising at least one optional component selected from the group consisting of: F) an optional matrix material selected from the group consisting of organic wax, a polymer compatible with the organofunctional silicone wax, a hardener, and a combination thereof: G) a vehicle; H) a wetting agent; I) an opacifying agent; J) an antifoaming agent; K) a pigment; L) a flame retardant; M) a spacer; N) a low melting metal, O) a reinforcing filler; and a combination thereof.

38. An interface material comprising I) the composition of claim 27, where the composition is formed as a flat member, a hemispherical nubbin, a convex member, a pyramid, or a cone.

39. The interface material of claim 38, where further comprising II) a release sheet, where the release sheet covers a surface of the composition.

40. The interface material of claim 38, where the composition is coated on a surface of a substrate.

41. The interface material of claim 40, where the substrate comprises a metal foil, a polyamide sheet, a polyimide sheet, or a polyethylene terephthalate polyester sheet.

42. The interface material of claim 41, where the composition is coated on two sides of the substrate.

43. The interface material of claim 40, further comprising II) a release sheet covering a surface of the composition opposite the substrate.

44. A method comprising:
  i) interposing the composition of claim 27, along a thermal path between a heat source and a heat spreader.

45. The method of claim 44, wherein the heat source comprises an electronic component.

46. The method of claim 44, where the heat spreader comprises a heat sink, a thermally conductive plate, a thermally conductive cover, a fan, or a circulating coolant system.

47. A device comprising:
  a) an electronic component
  b) an interface material, and
  c) an heat sink;
  where the interface material is arranged along a thermal path extending from a surface of the electronic component to a surface of the heat sink, where the interface material comprises the composition of claim 27.

48. A device comprising:
  a) a heat spreader, and
  b) an interface material on a surface of the heat spreader, where the interface material and the heat spreader are configured to comprise a portion of a thermally conductive path between an electronic component and a heat sink, and where the interface material comprises the composition of claim 27.

49. The composition of claim 27, where the crosslinked organofunctional silicone wax comprises a reaction product of:
  a) a crosslinking agent comprising an alpha-, omega-diene, an 1-alkenyl-functional organopolysiloxane having at least two 1-alkenyl groups per molecule, or a combination thereof;
  b) an alpha-olefin; and
  c) a siloxane having silicon-bonded hydrogen atoms or an organosiloxane having silicon-bonded hydrogen atoms.

50. The composition of claim 27, where component A) is present in an amount of about 4 to about 10% based on the weight of the composition.

51. The composition of claim 27, where component B) is present in an amount of about 90 to about 96% based on the weight of the composition.

* * * * *